(12) United States Patent
Ouderkirk et al.

(10) Patent No.: US 7,303,315 B2
(45) Date of Patent: Dec. 4, 2007

(54) ILLUMINATION ASSEMBLY USING CIRCUITIZED STRIPS

(75) Inventors: Andrew J. Ouderkirk, Woodbury, MN (US); Denny G. Aeschliman, Austin, TX (US); Hung T. Tran, Woodbury, MN (US); Kenneth A. Epstein, St. Paul, MN (US); Michael A. Meis, Stillwater, MN (US); John C. Schultz, Afton, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 3 days.

(21) Appl. No.: 10/982,651

(22) Filed: Nov. 5, 2004

(65) Prior Publication Data
US 2006/0098438 A1 May 11, 2006

(51) Int. Cl.
*H01L 33/00* (2006.01)
*F21V 29/00* (2006.01)

(52) U.S. Cl. ............... 362/294; 362/249; 362/373; 362/800; 257/99

(58) Field of Classification Search ................ 362/612, 362/555, 545, 547, 800, 580, 646–647, 227, 362/236, 238, 294, 373, 249; 257/675, 706, 257/712, 720, 99
See application file for complete search history.

(56) References Cited

U.S. PATENT DOCUMENTS

| | | | |
|---|---|---|---|
| 5,808,794 A | 9/1998 | Weber et al. | |
| 5,882,774 A | 3/1999 | Jonza et al. | |
| 6,412,971 B1 | 7/2002 | Wojnarowski et al. | |
| 6,874,910 B2 * | 4/2005 | Sugimoto et al. | 362/294 |
| 7,105,931 B2 * | 9/2006 | Attarwala | 257/783 |
| 2005/0116235 A1 * | 6/2005 | Schultz et al. | 257/79 |

FOREIGN PATENT DOCUMENTS

EP 1 502 752 2/2005

(Continued)

OTHER PUBLICATIONS

"3M Flexible Heat Sink", 3M Electronics Markets Material Division, Preliminary Technical Data, Aug. 2004.

(Continued)

*Primary Examiner*—Sandra O'Shea
*Assistant Examiner*—James W Cranson, Jr.
(74) *Attorney, Agent, or Firm*—William D. Miller

(57) ABSTRACT

An illumination assembly includes a heat dissipating member having a plurality of circuitized strips disposed thereon a spaced relationship. Each circuitized strip includes an electrically insulative substrate having at least one circuit trace on a first side of the substrate and an electrically and thermally conductive layer on a second side of the substrate, such that the at least one circuit trace is electrically insulated from the second side of the substrate. The circuitized strips have a plurality of vias extending from the first side to the second side of the substrate. A plurality of LEDs are disposed in the plurality of vias, such that each LEDs is disposed on the electrically and thermally conductive layer on the second side of the substrate and electrically connected to the at least one circuit trace on the first side of the substrate.

21 Claims, 4 Drawing Sheets

FOREIGN PATENT DOCUMENTS

| WO | WO 00/69000 | 11/2000 |
|---|---|---|
| WO | WO 03/012884 | 2/2003 |
| WO | WO 2005/062389 | 7/2005 |

OTHER PUBLICATIONS

U.S. Application entitled "Reflective Light Coupler", filed on Dec. 2, 2003, having U.S. Appl. No. 10/726,244.

U.S. Application entitled "Illumination Assembly", filed on Dec. 2, 2003, having U.S. Appl. No. 10/727,220.

U.S. Application entitled "LED Array Systems", filed on Jun. 1, 2004, having U.S. Appl. No. 10/858,539.

West et al., "LED Backlight for Large Area LCD TV's", http://www.lumileds.com/solutions/LCD/Luxeon_Direct-SID_2003.pdf.

West et al., "High Brightness Direct LED Backlight for LCD-TV", SID 03 Digest, ISSN/0003-0966X/03/3403-0694, 2003.

* cited by examiner

ILLUMINATION ASSEMBLY USING CIRCUITIZED STRIPS

BACKGROUND

The present invention generally relates to a lighting or illumination assembly. More particularly, the present invention relates to a lighting or illumination assembly that uses an array of light emitting diodes (LEDs).

Illumination systems are used in a variety of diverse applications. Traditional illumination systems have used lighting sources such as incandescent or fluorescent lights, for example. More recently, other types of light emitting elements, and light emitting diodes (LEDs) in particular, have been used in illumination systems. LEDs have the advantages of small size, long life and low power consumption. These advantages of LEDs make them useful in many diverse applications, and LEDs are frequently replacing other lighting sources.

For many lighting applications, it is necessary or desirable to have a plurality of LEDs supply the required light intensity and/or distribution. For example, a plurality of LEDs can be assembled in an array having small dimensions to provide a high illuminance in a small area, or a plurality of LEDs can be distributed over a larger area to provide a broader and more uniform illuminance.

LEDs in an array are commonly connected to each other and to other electrical systems by mounting on a printed circuit board. However, when LEDs are required to be distributed over a large area (as when backlighting a large high performance display device, for example), the use of a printed circuit board becomes problematic for several reasons. For example, printed circuit boards may be difficult to produce and/or handle in the sizes and shapes required for some display devices (e.g., very long and narrow strips). The rigidity of the printed circuit board material may make manufacturing or assembly difficult, especially where the printed circuit board must conform to a non-planar shape. Additionally, the heat dissipation requirements of the LEDs may not be met by conventional printed circuit board constructions. Therefore, an illumination assembly that addresses these problems is needed.

BRIEF SUMMARY

The present application discloses an illumination assembly using an array of LEDs. In some embodiments, the assembly comprises a heat dissipating member having a plurality of circuitized strips disposed thereon a spaced relationship. Each circuitized strip includes an electrically insulative substrate having at least one circuit trace on a first side of the substrate and an electrically and thermally conductive layer on a second side of the substrate, such that the at least one circuit trace is electrically insulated from the second side of the substrate. The circuitized strips also have a plurality of vias extending from the first side to the second side of the substrate. A plurality of LEDs are disposed in the plurality of vias. Each of the LEDs is disposed on the electrically and thermally conductive layer on the second side of the substrate and electrically connected to the at least one circuit trace on the first side of the substrate.

In some embodiments, the assembly comprises a flexible circuit having an electrically insulative substrate having at least one circuit trace on a first side thereof, and a plurality of vias extending from the first side to a second side of the substrate. An LED is disposed in at least one of the vias, and an electrically conductive heat dissipating member is disposed proximate the second side of the flexible circuit. The LED is electrically connected to both the heat dissipating member and the at least one circuit trace.

Methods for producing an illumination assembly are also disclosed. In some embodiments, the method comprises providing an insulative substrate, providing a plurality of circuit traces on the insulative substrate, providing a plurality of rows of vias in the insulative substrate, each row of vias having at least one associated circuit trace, separating the substrate into a plurality of strips, each strip including one of the plurality of rows of vias and associated circuit trace, populating at least one via of each strip with an LED, the LED electrically connected to the associated circuit trace, and disposing at least two of the plurality of strips on a heat sink to form an array of LEDs, wherein the LEDs of each strip are electrically connected to the heat sink.

DESCRIPTION OF THE ILLUSTRATIVE EMBODIMENTS

In the following description, reference is made to the accompanying drawings. The reader will understand that other embodiments can be utilized and structural or logical changes may be made. The following detailed description, therefore, is not to be taken in a limiting sense, and the scope of the present invention is defined by the appended claims.

As used herein, the terms "LED" and "light emitting diode" are used to refer generally to light emitting semiconductor elements with contact areas for providing power to the diode. Different forms of inorganic semiconductor light emitting diodes may be formed, for example, from a combination of one or more Group III elements and of one or more Group V elements (III-V semiconductor). Examples of III-V semiconductor materials that can be used in an LED include nitrides, such as gallium nitride or indium gallium nitride, and phosphides, such as indium gallium phosphide. Other types of III-V materials can also be used, as can inorganic materials from other groups of the periodic table.

The LEDs may be in packaged or non-packaged form, including for example LED dies, surface-mounted LEDs, chip-on-board LEDs and LEDs of other configurations. Chip-on-board (COB) refers to a hybrid technology that employs face-up-bonded chip devices interconnected to a substrate conventionally, for example using wire bonding. The term LED also includes LEDs packaged or associated with a phosphor where the phosphor converts light emitted from the LED to light at a different wavelength. Electrical connections to the LED can be made by wire bonding, tape automated bonding (TAB), or flip-chip bonding. The LEDs are schematically depicted in the illustrations, and can be unpackaged LED dies or packaged LEDs as described herein.

LEDs can be selected to emit at any desired wavelength, such as in the red, green, blue, ultraviolet, or infrared spectral regions. In an array of LEDs, the LEDs can each emit in the same spectral region, or can emit in different spectral regions. Different LEDs may be used to produce different colors where the color of light emitted from the light emitting element is selectable.

Figure 1:
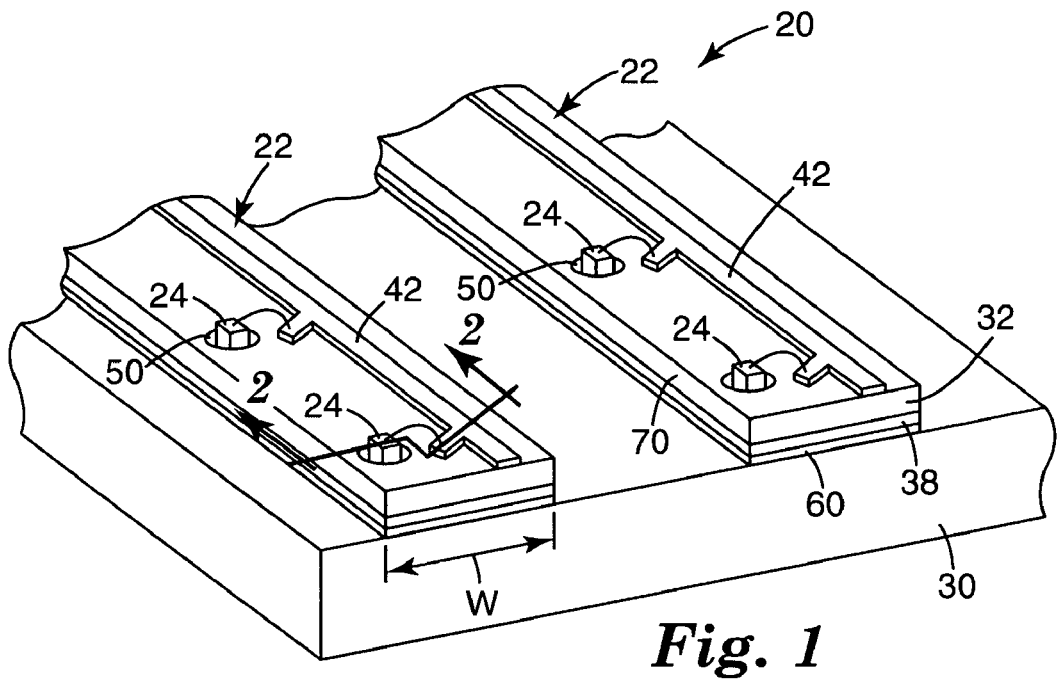
FIG. 1 is a perspective view of an exemplary illumination assembly.

FIG. 1 shows a perspective view of a portion of an illumination assembly 20. The illumination assembly 20 includes one or more longitudinal circuitized strips 22. Each circuitized strip 22 carries a plurality of LEDs 24 and is attached to a heat dissipation device 30. As used herein, the term "heat dissipation device" is used to refer generally to any device or element that enhances heat transfer away from a hot location, such as the surface of a heat generating LED, to a cooler thermal mass. The cooler thermal mass can be a fluid (such as ambient air or a liquid coolant), or a solid (such as a large metal block). Heat dissipation devices can be passive or active, and utilize solid or fluid thermal masses alone or in combination with each other. Heat dissipation devices include, for example, heat sinks, heat spreaders, heat pipes, and heat exchangers. Heat dissipation devices can include radiating fins or other surfaces for enhancing heat transfer.

The heat dissipation device 30 is made of a thermally and electrically conductive material. Suitable materials for the heat dissipation device 30 include metals such as aluminum or copper, or metal alloys including, for example, copper molybdenum. In alternate embodiments, non-metallic thermally conductive materials can be used. An exemplary non-metallic material is a graphite and silicone composite material available as 3M Flexible Heat Sink, from 3M Company of Saint Paul, Minn. Preferably, heat dissipation device 30 has a low thermal resistance and a low electrical resistivity. In some embodiments, heat dissipation device 30 has a thermal resistance from about 15 to 20° C/W, and an electrical resistivity in the range of about $1.7 \times 10^{-8}$ ohmmeter or less.

Figure 2:
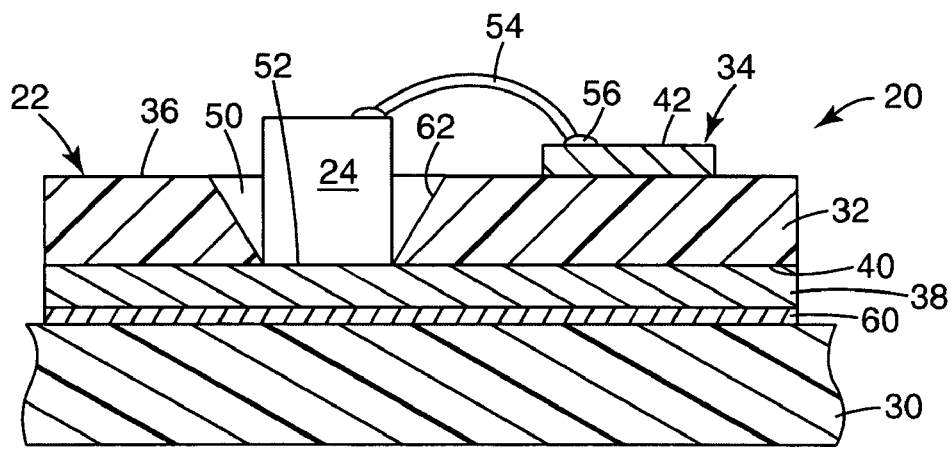
FIG. 2 is schematic sectional view taken along lines 2-2 of FIG. 1.

As best seen in FIG. 2, each circuitized strip 22 includes an electrically insulative dielectric substrate 32 having an electrically conductive layer 34 on at least a first side 36 thereof, and an electrically and thermally conductive layer 38 on a second side 40 thereof. As shown in FIGS. 1 and 2, the electrically conductive layer 34 on the first side 36 of the substrate 32 is patterned to form at least one circuit trace 42, while the layer 38 on the second side 40 of the substrate 32 can remain unpatterned. The layer 34 can alternatively be patterned to form a plurality of circuit traces on the first side 36 of the substrate 32, including power and signal traces for operative electrical connection to the LEDs 24.

The electrically insulative dielectric substrate 32 may be comprised of a variety of suitable materials, including polyimide, such as Kapton-brand polyimide manufactured by Du Pont, Wilmington, Del., polyester, polyethyleneterephthalate (PET), multilayer optical film (as disclosed in U.S. Pat. No. 5,882,774 (Jonza et al),and U.S. Pat. No. 5,808,794 (Weber et al)., incorporated by reference herein in their entirety), polycarbonate, polysulfone, or FR4 epoxy composite, for example. In some embodiments, substrate 32 can be flexible. The electrically and thermally conductive layers 34, 38 on the first and second sides 36, 40 of the substrate 32 may be comprised of a variety of suitable materials, preferably metals including but not limited to copper, nickel, gold, aluminum, tin, lead, chrome, and combinations thereof, for example. In embodiments where substrate 32 is flexible, it is preferred that the layers 34, 38 are also flexible. A suitable flexible material having a polyimide insulative substrate with copper conductive layers thereon is 3M™ Flexible Circuitry, available from 3M Company of Saint Paul, Minn.

The multilayer optical films referred to above can be made by coextrusion of alternating polymer layers. In such polymeric multilayer optical films, polymer materials are used predominantly or exclusively in the makeup of the individual layers. Such films are compatible with high volume manufacturing processes, and can be made in large sheets and roll goods. The films comprise individual microlayers having different refractive index characteristics so that some light is reflected at interfaces between adjacent microlayers. The microlayers are sufficiently thin so that light reflected at a plurality of the interfaces undergoes constructive or destructive interference in order to give the film the desired reflective or transmissive properties. For optical films designed to reflect light at ultraviolet, visible, or near-infrared wavelengths, each microlayer generally has an optical thickness (i.e., a physical thickness multiplied by refractive index) of less than about 1 µm. Thicker layers can, however, also be included, such as skin layers at the outer surfaces of the film, or protective boundary layers disposed within the film that separate packets of microlayers.

The reflective and transmissive properties of multilayer optical films are a function of the refractive indices of the respective microlayers. Each microlayer can be characterized at least in localized positions in the film by in-plane refractive indices $n_x$, $n_y$, and a refractive index $n_z$ associated with a thickness axis of the film. These indices represent the refractive index of the subject material for light polarized along mutually orthogonal x-, y-, and z-axes, respectively. In practice, the refractive indices are controlled by judicious materials selection and processing conditions. The multilayer optical film can be made by co-extrusion of typically tens or hundreds of layers of two alternating polymers A, B, followed by optionally passing the multilayer extrudate through one or more multiplication die, and then stretching or otherwise orienting the extrudate to form a final film. The resulting film is composed of typically tens or hundreds of individual microlayers whose thicknesses and refractive indices are tailored to provide one or more reflection bands in desired region(s) of the spectrum, such as in the visible or near infrared. In order to achieve high reflectivities with a reasonable number of layers, adjacent microlayers preferably exhibit a difference in refractive index ($\Delta n_x$) for light polarized along the x-axis of at least 0.05. If the high reflectivity is desired for two orthogonal polarizations, then the adjacent microlayers also preferably exhibit a difference in refractive index ($\Delta n_y$) for light polarized along the y-axis of at least 0.05.

If desired, the refractive index difference ($\Delta n_z$) between adjacent microlayers for light polarized along the z-axis can also be tailored to achieve desirable reflectivity properties for the p-polarization component of obliquely incident light. For ease of explanation, at any point of interest on a multilayer optical film the x-axis will be considered to be oriented within the plane of the film such that the magnitude of $\Delta n_x$ is a maximum. Hence, the magnitude of $\Delta n_y$ can be equal to or less than (but not greater than) the magnitude of $\Delta n_x$. Furthermore, the selection of which material layer to begin with in calculating the differences $\Delta n_x$, $\Delta n_y$, $\Delta n_z$ is dictated by requiring that $\Delta n_x$ be non-negative.

In other words, the refractive index differences between two layers forming an interface are $\Delta n_j = n_{1j} - n_{2j}$, where j=x, y, or z and where the layer designations 1,2 are chosen so that $n_{1x} \geq n_{2x}$, i.e., $\Delta n_x \geq 0$.

To maintain high reflectivity of p-polarized light at oblique angles of incidence, the z-index mismatch $\Delta n_z$ between microlayers can be controlled to be substantially less than the maximum in-plane refractive index difference $\Delta n_x$, such that $\Delta n_z \leq 0.5 * \Delta n_x$. More preferably, $\Delta n_z \leq 0.25 * \Delta n_x$. A zero or near zero magnitude z-index mismatch yields interfaces between microlayers whose reflectivity for p-polarized light is constant or near constant as a function of incidence angle. Furthermore, the z-index mismatch $\Delta n_z$ can be controlled to have the opposite polarity compared to the in-plane index difference $\Delta n_x$, i.e. $\Delta n_z < 0$. This condition yields interfaces whose reflectivity for p-polarized light increases with increasing angles of incidence, as is the case for s-polarized light.

Alternatively, the multilayer optical film can have a simpler construction in which all of the polymeric microlayers are isotropic in nature, i.e., $n_x = n_y = n_z$ for each layer. Furthermore, known self-assembled periodic structures, such as cholesteric reflecting polarizers and certain block copolymers, can be considered multilayer optical films for purposes of this application. Cholesteric mirrors can be made using a combination of left and right handed chiral pitch elements.

Referring again to FIG. 2, the substrate 32 further has a plurality of through-holes or vias 50 extending through the substrate 32 from the first side 36 to the second side 40 of the substrate 32. Each via 50 is configured to receive an LED 24 therein. Depending upon the manufacturing process and materials used, the vias 50 can be chemically etched, plasma etched, laser milled, or punched through the insulative substrate 32, as is known in the art.

In the Figures, the circuitized strips 22 have a width W sufficient to accommodate a single row of vias. In other embodiments, the width W of the circuitized strips 22 may accommodate two or more rows of vias. Depending upon the particular lighting application and its associated brightness and resolution requirements, the LEDs 24 may be arranged along a given circuitized strip 22 with an LED-to-LED spacing (pitch) in the range of 3 mm to 15 mm. In some applications, such as where very high resolution and/or brightness is required, the desired pitch may be less than 3 mm. In other applications, where the resolution and/or brightness requirements are low, the desired pitch may be more than 15 mm.

During assembly, the vias 50 provide the advantage of a convenient alignment point for placing the LEDs 24. Preferably, the vias 50 do not extend through the electrically and thermally conductive layer 38 provided on the second side 40 of the substrate 32, such that LEDs 24 placed in the vias 50 may be attached to the layer 38 during the manufacturing process. The electrically and thermally conductive layer 38 may serve a combination of purposes, including making an electrical connection to the LEDs 24, providing a direct thermal pathway from the LEDs 24 to the underlying heat dissipation device 30, providing heat spreading laterally away from the LEDs 24, and providing electrical connections to other systems, for example. In the illumination assembly 20 of FIGS. 1 and 2, the LEDs 24 illustrated are of the type having one electrical contact on the base 52 of the LED 24 and another electrical contact on the opposite (top) surface of the LED 24. The contact on the base 52 of each LED 24 is electrically and thermally connected to the layer 38 on the second side 40 of the substrate 32, while the contact on the top of each LED 24 is electrically connected to the circuit trace 42 on the first side 36 of the substrate 32 by a wirebond 54 extending from LED 24 to a bond pad 56 on the circuit trace 42.

Thermally and electrically conductive adhesives, solder re-flow, thermosonic bonding (if the LED die has an appropriate backside metallization), and Au/Sn eutectic bonding are among the attachment methods that can be used to attach the LEDs 24 to the thermally and electrically conductive layer 38 on the second side 40 of the substrate 32. Solder typically has a lower thermal resistance than an adhesive, but not all LEDs 24 have solderable base metallization. Solder attachment also has the advantage of LED 24 self-alignment, due to the surface tension of the molten solder aligning the LED 24 during processing. However, some LEDs may be sensitive to solder reflow temperatures, making an adhesive more appropriate.

The LEDs 24 are disposed in at least some of the vias 50. Some of the vias 50 may optionally be left unpopulated with LEDs 24. For example, in some embodiments, every other via can be left unpopulated. The unpopulated vias 50 are useful for several purposes. If, after populating some of the vias in the circuitized strips with LEDs, an LED is found to be defective during testing, a replacement LED may be attached in an unpopulated via next to the defective LED. The unpopulated vias also can be used to make appropriate power and signal connections to the circuitized strip 22, or as alignment points for registration with other elements of the assembly.

The circuitized strips 22 with attached LEDs 24 are disposed on the heat dissipation device 30 such that the first side 36 is facing away from the heat dissipation device 30, and the electrically and thermally conductive layer 38 is adjacent the heat dissipation device 30. The circuit traces 42 on the first side 36 of the substrate 32 are thus electrically insulated from the electrically conductive layer 38 and the heat dissipation device 30 by the substrate 32. The electrically and thermally conductive layer 38 on the second side 40 of the substrate 32 is preferably mounted on the heat dissipation device 30 using an electrically and thermally conductive bond, illustrated in FIGS. 1 and 2 as bonding layer 60. Thermally and electrically conductive adhesives or solder are among the attachment methods that can be used to attach the layer 38 to the heat dissipation device 30. Thus, in addition to being an active element of the thermal control system of the illumination assembly 20, the heat dissipation device 30 is also an active element of the electrical circuits of the illumination assembly 20. For example, the heat dissipation device 30 may provide a common electrical ground to each of the LEDs 24 in the circuitized strips 22. Further, when heat dissipation device 30 is composed of a material having good electrical conductivity, additional benefits including an even current distribution with low voltage drop, and EMI shielding are beneficially provided.

The layer 38 on the second side 40 of the substrate 32 and the heat dissipation device 30 can both be metals, and the circuitized strips 22 can be mounted onto the heat dissipation device 30 by applying solder to at least one of the metal surfaces to be bonded, then causing the metal surfaces of layer 38 and heat dissipation device 30 to be soldered to each other. Suitable soldering methods include reflow soldering and wave soldering. Soldering may also be performed using solder paste and laminating the circuitized strips 22 to the metal heat dissipation device 30 with a heated nip or stamp. The bond between the circuitized strip 22 and the heat dissipation device 30 may extend over the entire area of the circuitized strip 22, or may cover only a portion of the circuitized strip. In some cases is it desirable for the layers or components of the illumination assembly between the LED and the heat dissipation device to provide a direct thermal pathway between the LED 24 and the heat dissipation device 30. In some cases, the circuitized strips 22 can be mounted on the heat dissipation device 30 before populating the circuitized strips 22 with LEDs 24.

In cases where unpackaged LED dies are used to populate the vias, the LEDs 24 typically are nominally 250 micrometers tall, the insulative substrate 32 is in the range of 25 to 50 micrometers thick, and the thickness of conductive layers 34, 36 is in the range of 17 to 34 micrometers, but can be varied to more or less than that range based on the power requirements of the LEDs 24. To facilitate good wirebonding at the bond pads 56, the bond pads 56 can include a surface metallization of nickel and gold. The vias 50 are illustrated as having sloped side walls 62, as is typical of chemically etched vias. However, vias that are plasma etched or laser milled may have substantially vertical side walls.

Figure 3:
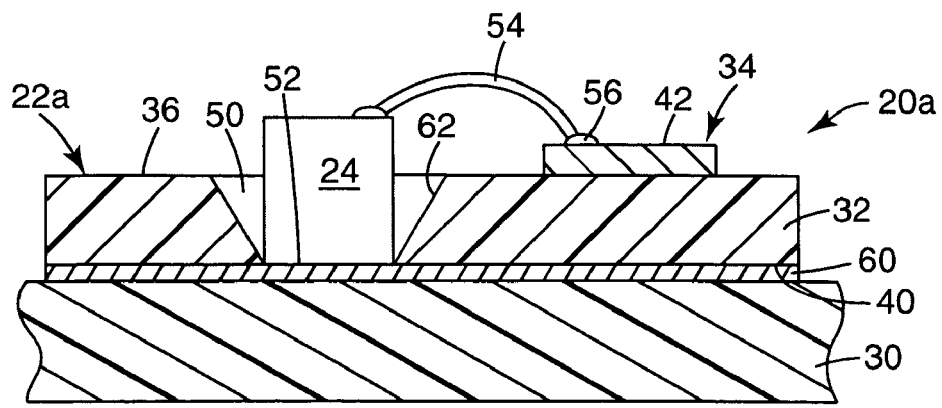
FIG. 3 is a schematic sectional view of another illumination assembly.

FIG. 3 is a schematic sectional view of an illumination assembly 20a similar to illumination assembly 20, but where circuitized strip 22a has been substituted for strip 22. The circuitized strip 22a of FIG. 3 differs from strip 22 of FIG. 2 in that the electrically and thermally conductive layer 38 on the second side 40 of the substrate 32 has been omitted. In the embodiment of FIG. 3, the circuitized strips 22a are mounted on the heat dissipation device 30 prior to populating all or a portion of the vias 50 with LEDs 24. When the vias 50 are populated with LEDs 24, the base 24 of each LED 24 is electrically and thermally connected directly to the heat dissipation device 30, while the contact on the top of each LED 24 is electrically connected to the circuit trace 42 by a wirebond 54 extending from LED 24 to a bond pad 56 on the circuit trace 42. In cases where there is no metal layer on the second side 40 of the substrate, the circuitized strip 22a may be attached by any suitable method, including thermally and electrically conductive adhesives, or solder. Even in cases where an adhesive is used to attach the substrate 32 to the heat dissipation device 30, a solder bond can also be formed between the LED 24 and the heat dissipation device 30 for improved thermal conductivity between the LED 24 and the heat dissipation device 30. The heat dissipation device 30 is thus an active thermal and electrical element of the illumination assembly 20.

Figure 4:
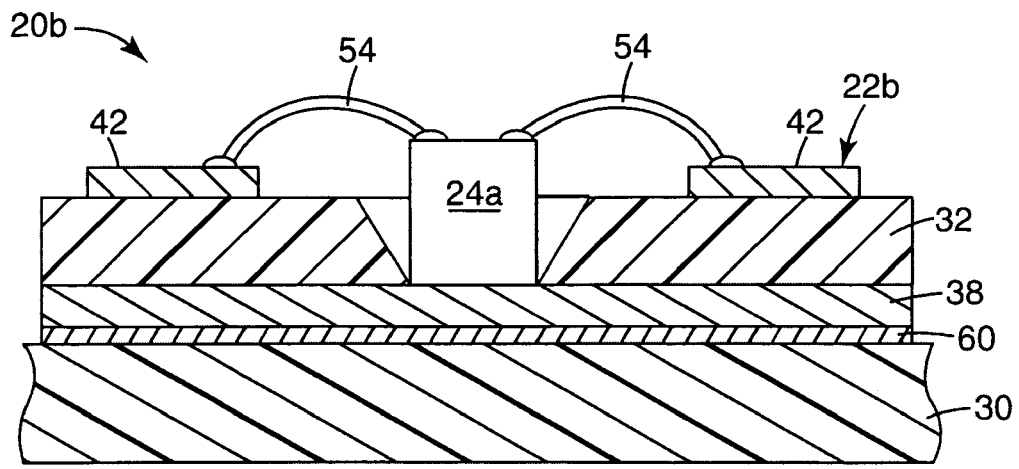
FIG. 4 is a schematic sectional view of the embodiment of FIG. 2, using a different type of LED.
Figure 5:
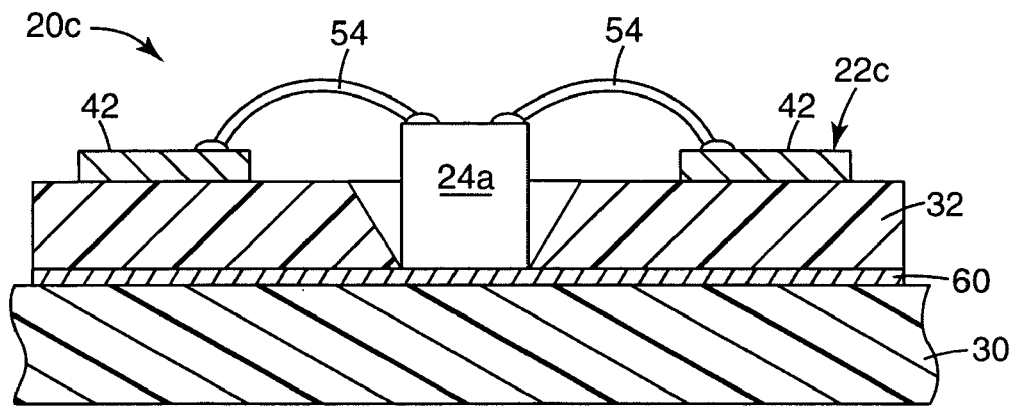
FIG. 5 is a schematic sectional view of the embodiment of FIG. 3, using a different type of LED.

FIGS. 4 and 5 are schematic sectional views of additional illumination assemblies 20b, 20c, respectively, that utilize alternative circuitized strips 22b, 22c. In FIGS. 4 and 5, the illustrated wirebonded LED 24a has both electrical contact pads on the same side of the LED, rather than on opposite sides of the diode as in the wirebonded LED 24 of FIGS. 1-3. The construction of the circuitized strip 22f. 4 is like strip 22 of FIG. 2, with the LED 24a positioned within the via 50 and thermally connected to layer 38 by the thermally conductive layer 60. The layer 60 may comprise adhesive, solder, a thermosonic bond, or an Au/Sn eutectic bond, for example. The construction of the circuitized strip 22c of FIG. 5 is like strip 22a of FIG. 3, with the LED 24a positioned within the via 50 and thermally connected to the heat dissipation device 30 by a thermally conductive adhesive or solder layer 60. In the illumination assemblies of FIGS. 4 and 5, the LEDs 24a are provided a direct thermal path to the heat dissipation device 30, but the heat dissipation device 30 is not an active electrical element of the illumination assembly 20.

Figure 7:
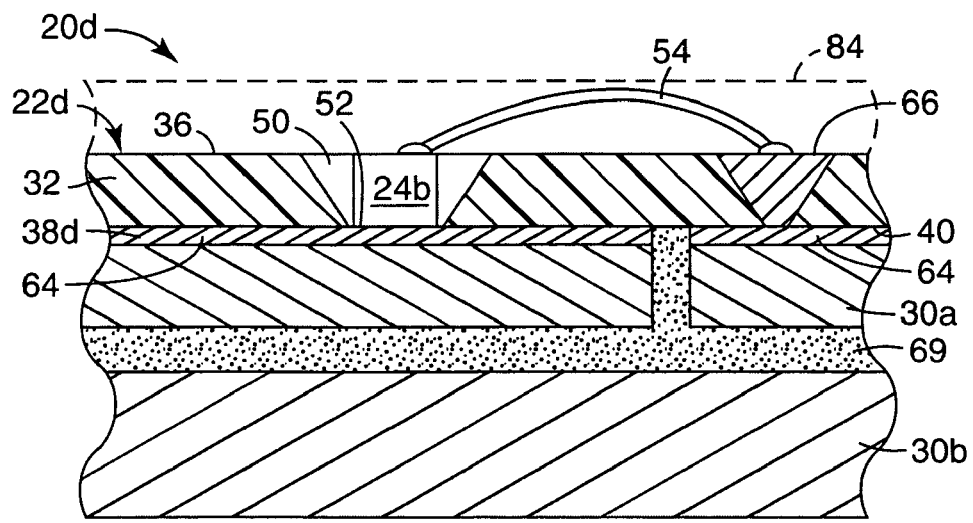
FIG. 7 is schematic sectional view taken along lines 7-7 of FIG. 6.
Figure 6:
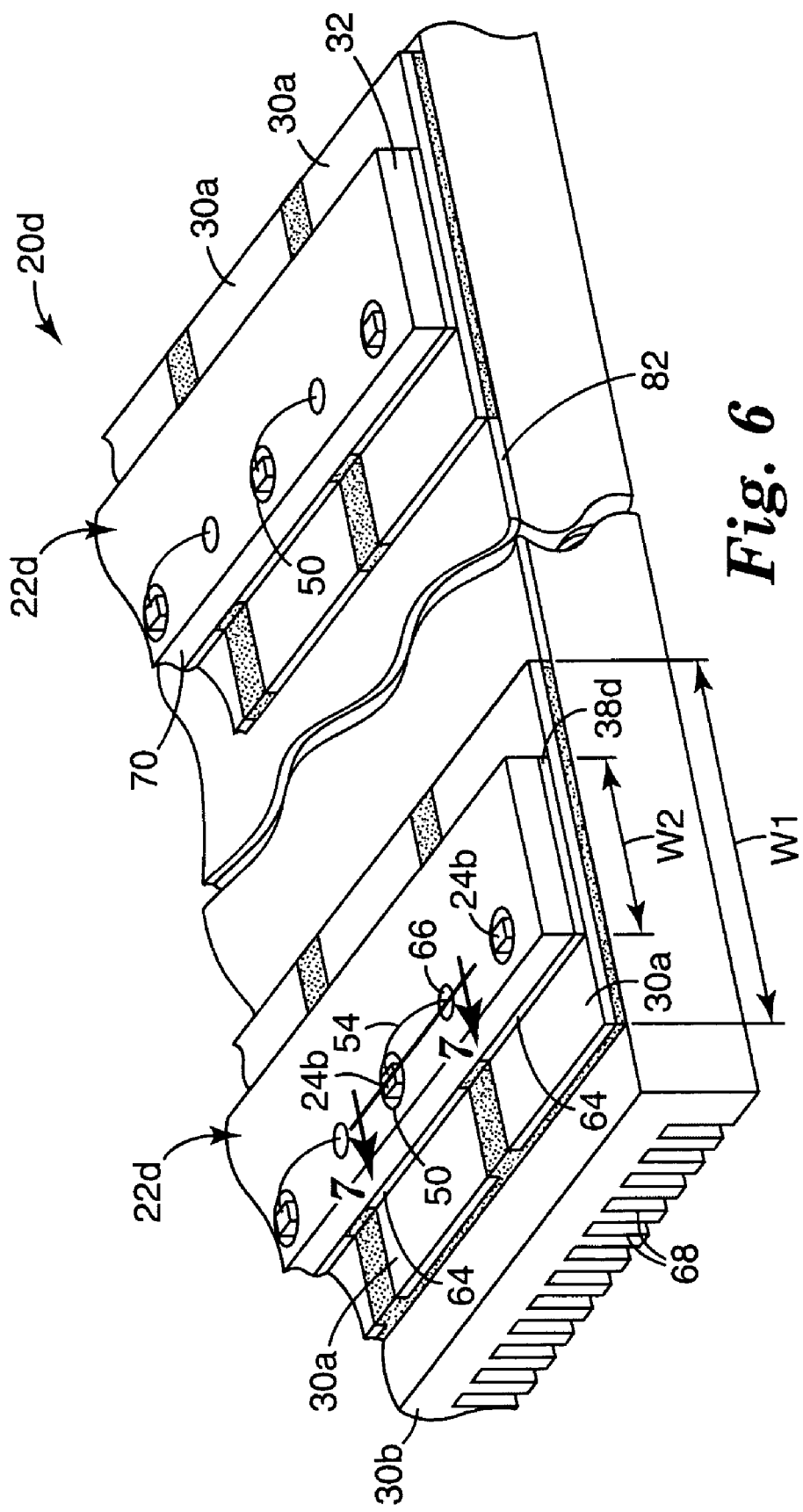
FIG. 6 is a perspective view of another exemplary illumination assembly.

FIGS. 6 and 7 illustrate an additional illumination assembly 20d that utilizes alternative circuitized strips 22d disposed on a combination of heat dissipation devices 30a, 30b. Each circuitized strip 22d includes an electrically insulative dielectric substrate 32 having a plurality of through-holes or vias 50 extending through the substrate 32 from the first side 36 to the second side 40 of the substrate 32. Each via 50 is configured to receive an LED 24b therein. An electrically and thermally conductive layer 38d is disposed on the second side 40 and extends across vias 50. The electrically and thermally conductive layer 38d is patterned to form a plurality of discrete sections 64, with each via 50 being associated with one of the sections 64.

The sections 64 of layer 38d may serve a combination of purposes, including making an electrical connection to the LEDs, providing a thermal pathway from the LEDs to the underlying heat dissipation devices 30a, 30b, providing heat spreading laterally away from the LEDs, and providing electrical connections to other systems, for example. In the illumination assembly 20d of FIGS. 6 and 7, the LEDs 24b illustrated are of the type having one electrical contact on the base 52 of the LED and another electrical contact on the opposite (top) surface of the LED. The contact on the base 52 of each LED is electrically and thermally connected to the associated section 64 of layer 38d, while the contact on the top of each LED is electrically connected to an adjacent section 64 by a wirebond 54 extending from LED 24b to filled via 66 extending through substrate 32. In other embodiments, via 66 may not be filled, and wirebond 54 can connect directly to the adjacent section 64. The discrete sections 64 of layer 38d allow the LEDs to be connected in series, which may be desirable in certain applications. As described above with respect to other embodiments, layer 38d can be a metal and can be attached to the LEDs 24b by attachment methods including thermally and electrically conductive adhesives, solder re-flow, thermosonic bonding (if the LED die has an appropriate backside metallization), and Au/Sn eutectic bonding.

For each of the circuitized strips 22d, the sections 64 of layer 38d are each directly bonded to an associated one of the first heat dissipation devices 30a. The first heat dissipation devices 30a have a width W1 greater than the width W2 of the strip 22d, and function as heat spreaders to aid in transferring heat generated by the associated LEDs to the second heat dissipation device 30b. Second heat dissipation device 30b can include features such as fins 68 to aid in dissipating heat from the assembly 20d.

In the illustrated embodiment, each first heat dissipation device 30a is electrically and thermally connected to an associated section 64 of layer 38d, but electrically isolated from the second heat dissipation device 30b. When the layer 38d and the first heat dissipation devices 30a are metal, each section 64 and the associated first heat dissipation device 30a can be thermally and electrically bonded by applying solder to at least one of the metal surfaces to be bonded, then causing the metal surfaces of layer 38d and first heat dissipation device 30a to be soldered to each other. Soldering may also be performed using solder paste and laminating the sections 64 of the circuitized strips 22d to the metal first heat dissipation devices 30a with a heated nip or stamp. First heat dissipation devices 30a are electrically separated from second heat dissipation device 30b by thermally conductive, electrically insulative layer 69. The material of layer 69 can be, for example, a thermally conductive adhesive such as a boron nitride loaded polymer, like that available as 3M 2810 from 3M Company, of Saint Paul, Minn.

Figure 8:
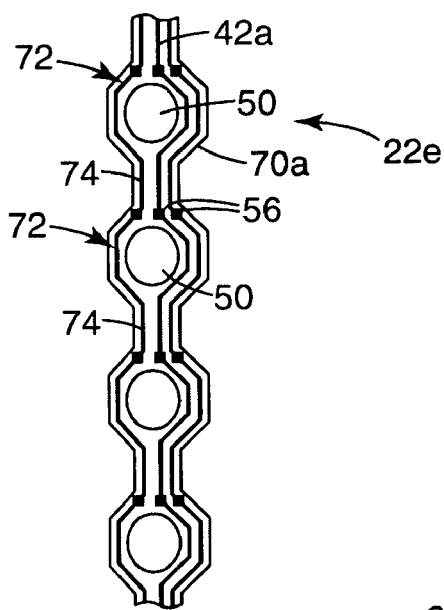
FIG. 8 is a schematic plan view of a circuitized strip having a complex side edge shape.

The circuitized strips of FIGS. 1 and 6 are illustrated as having straight side edges 70 as formed, for example, by slitting the substrate. In other embodiments, the circuitized strips may have a complex side edge formed, for example, by die cutting or etching processes. In FIG. 8, an exemplary circuitized strip 22e having a complex side edge 70a is illustrated in top or plan view. Strip 22e includes a plurality of relatively wide enlarged regions 72 separated by a plurality of relatively narrow necked regions 74. A plurality of power and signal conductive traces 42a are provided on the first surface of the substrate 32. The enlarged regions 72 each include a via 50 for receiving an LED (not shown), and bonding pads 56 for making electrical connections to the LEDs and other electrical systems.

Figure 9:
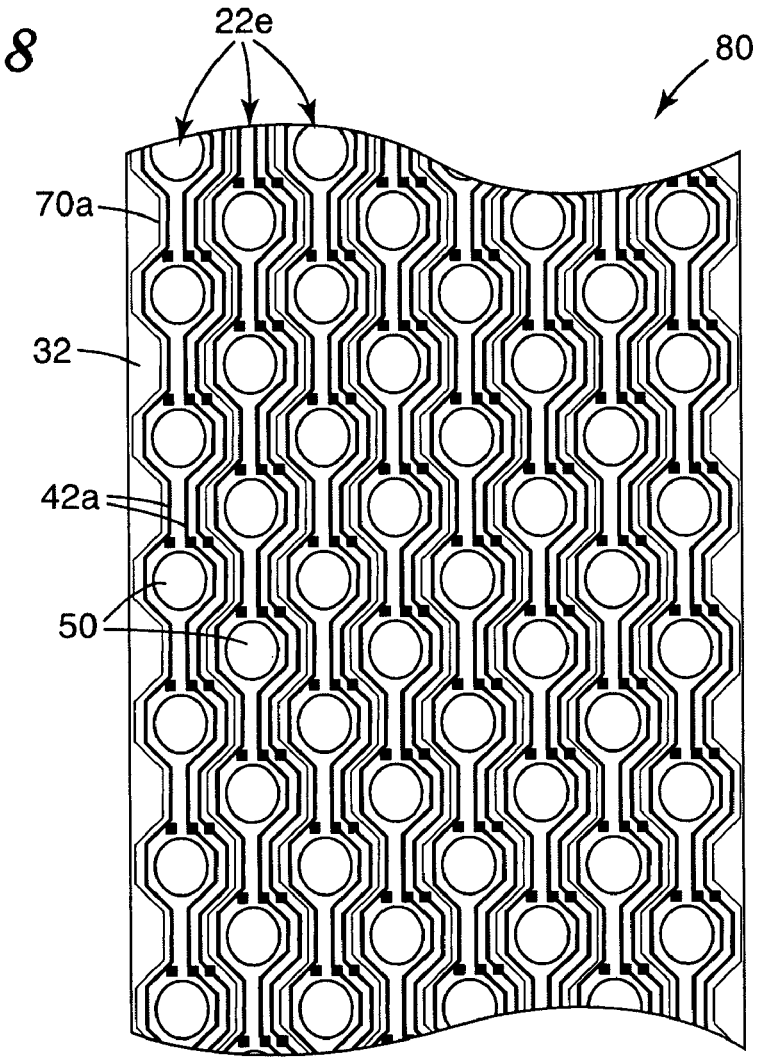
FIG. 9 is a schematic plan view of a substrate web before separating individual circuitized strips.

The circuitized strips of FIGS. 1-8 can be manufactured from a sheet or web of the insulative dielectric substrate. FIG. 9 illustrates one method for manufacturing the circuitized strips 22e of FIG. 8. A web or sheet 80 of the insulative dielectric substrate 32 is metallized and patterned to have a plurality of conductive traces 42a thereon. The web or sheet 80 is then slit, die cut, provided with zipped perforations and torn, or etched to separate the individual circuitized strips 22e. In FIG. 9, it can be seen how the complex side edge 70a shape beneficially minimizes unused areas of the substrate 32. After the circuitized strips 22e are separated, LEDs can be attached to the circuitized strips 22e by mounting in some or all of the vias as described above, and the strips 22e are mounted on the heat dissipation device in a desired arrangement and spacing.

In all of the illumination assembly embodiments, the disclosed circuitized strips, or LEDs, or both can be combined with other optical devices, films, or other elements on the illumination assembly. Such devices, films, or other elements may include, for example, light absorbing masking components, highly reflective materials, and encapsulants, and phosphors.

Encapsulants can be directly applied to all or some of the LEDs, prior to or after separating the circuitized strips from the web 80. Encapsulants can cover the LEDs individually, or as groups of two or more LEDs. The shape and position of the encapsulants can provide desired light guiding or light extraction effects. The encapsulant can form the final desired shape of the LED, or may be later covered with another encapsulant layer. Covering the initial encapsulant layer with another encapsulant layer allows more expensive, high refractive index, slow curing encapsulants, and generic encapsulant shapes to be generated while the LED populated circuitized strips are easily handled, and allows more complex encapsulant shapes to be applied at a later time. The shape of the encapsulant may distribute light through a combination of refraction and reflection. The encapsulant may also produce the desired light output profile in combination with other optical components. Other optical elements can be applied between the circuitized strips, over the LEDs or between the LEDs, depending upon the desired optical properties of the illumination assembly.

The assembly 20d of FIG. 6 illustrates an optical film layer 82 disposed between first heat dissipation devices 30a of adjacent circuitized strips 22d. In alternate embodiments, layer 82 can extend over first heat dissipation devices 30a, or entirely over the circuitized strips if layer 80 is provided with apertures at the positions of the LEDs. In FIG. 7, an optional encapsulant 84 is illustrated extending over the first side 36 of the substrate 32. The optical film layer 82 and encapsulant 84 can be used in conjunction with any of the illumination assemblies described herein.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An illumination assembly, comprising:
    a heat dissipating member;
    a plurality of circuitized strips disposed on the heat dissipating member in a spaced relationship, each such strip including an electrically insulative substrate having at least one circuit trace on a first side of the substrate and an electrically and thermally conductive layer on a second side of the substrate, the at least one circuit trace being electrically insulated from the second side of the substrate, the circuitized strips also having a plurality of vias extending from the first side to the second side of the substrate; and
    a plurality of LEDs disposed in the plurality of vias, each of the LEDs disposed on the electrically and thermally conductive layer on the second side of the substrate and electrically connected to the at least one circuit trace on the first side of the substrate.

2. The assembly of claim 1, wherein the LEDs are electrically connected to the electrically and thermally conductive layer on the second side of the substrate.

3. The assembly of claim 2, wherein the heat dissipating member is electrically conductive, and wherein the electrically and thermally conductive layer on the second side of the substrate is electrically connected to the heat dissipating member.

4. The assembly of claim 1, wherein the plurality of vias of each substrate strip are arranged in a single line.

5. The assembly of claim 1, further comprising an optical film disposed between at least two adjacent circuitized strips.

6. The assembly of claim 1, wherein the circuitized strips are flexible.

7. The assembly of claim 1, wherein the electrically insulative substrate comprises a material selected from the group comprising polyimide, polyester, polyethyleneterephthalate (PET), optically reflective insulative polymers, multilayer optical film (MOF), polycarbonate, polysulfone, FR4 epoxy composite, and combinations thereof.

8. The assembly of claim 7, wherein the electrically insulative substrate consists essentially of multilayer optical film (MOF).

9. The assembly of claim 6, wherein the thermally and electrically conductive layer on the second side of the substrate comprises a material selected from the group comprising copper, nickel, gold, aluminum, tin, lead, and combinations thereof.

10. The assembly of claim 1, wherein a single LED is disposed in each of the plurality of vias.

11. The assembly of claim 1, wherein at least one of the plurality of vias does not have any LED disposed therein.

12. The assembly of claim 1, wherein each LED is electrically coupled to the at least one circuit trace by a wirebond.

13. The assembly of claim 1, wherein each LED is disposed within the respective via in electrical contact with the electrically conductive layer on the second side of the substrate.

14. An illumination assembly, comprising:
a flexible circuit comprising an electrically insulative substrate having at least one circuit trace on a first side thereof, and a plurality of vias extending through the substrate from the first side to a second side of the substrate, the at least one circuit trace being electrically insulated from the second side of the substrate;
an LED disposed in at least one of the plurality of vias; and
an electrically conductive heat dissipating member disposed proximate the second side of the flexible circuit;
wherein the LED is electrically connected to both the heat dissipating member and the at least one circuit trace.

15. The assembly of claim 14, wherein the LED is one of a plurality of LEDs disposed in the vias, wherein each of the plurality of LEDs is electrically connected to both the heat dissipating member and the at least one circuit trace.

16. The assembly of claim 14, wherein the flexible circuit is one of a plurality of flexible circuits positioned on the heat dissipating member in a spaced relationship, each flexible circuit comprising an electrically insulative substrate having at least one circuit trace on a first side thereof, and a plurality of vias extending through the substrate from the first side to a second side of the substrate, wherein each flexible circuit includes an LED in at least one of the vias, and wherein the LEDs are electrically connected to the heat dissipating member.

17. A method for producing an illumination assembly, comprising:
providing an electrically insulative substrate;
providing a plurality of circuit traces on the electrically insulative substrate;
providing a plurality of rows of vias in the electrically insulative substrate, each row of vias having at least one associated circuit trace;
separating the substrate into a plurality of strips, each strip including one of the plurality of rows of vias and associated circuit trace;
populating at least one via of each strip with an LED, the LED electrically connected to the associated circuit trace; and
disposing at least two of the plurality of strips on a heat sink to form an array of LEDs, wherein the LEDs of each strip are electrically connected to the heat sink.

18. The method of claim 17, wherein the rows of vias are spaced from each other by a first distance prior to separating the substrate into a plurality of strips, and by a second distance after mounting to a printed circuit board.

19. The method of claim 18, wherein the first distance is smaller than the second distance.

20. The method of claim 17, wherein the electrically insulative substrate comprises a material selected from the group comprising polyimide, polyester, polyethyleneterephthalate (PET), optically reflective insulative polymers, multilayer optical film (MOF), polycarbonate, polysulfone, FR4 epoxy composite, and combinations thereof.

21. The method of claim 20, wherein the electrically insulative substrate consists essentially of multilayer optical film (MOF).

* * * * *

UNITED STATES PATENT AND TRADEMARK OFFICE
CERTIFICATE OF CORRECTION

PATENT NO. : 7,303,315 B2
APPLICATION NO. : 10/982651
DATED : December 4, 2007
INVENTOR(S) : Andrew J. Ouderkirk It is certified that error appears in the above-identified patent and that said Letters Patent is hereby corrected as shown below:

Column 5
Line 3, Delete "In other words,……………………..i.e., $\Delta n_x \geq 0$." and insert the same on Col. 5, Line 2, after "non-negative." as the continuation of the same paragraph.

Column 7
Line 54, Delete "22f . 4" and insert -- 22b of FIG. 4 --, therefor.

Signed and Sealed this

Nineteenth Day of August, 2008

JON W. DUDAS
*Director of the United States Patent and Trademark Office*